(12) United States Patent
Mori et al.

(10) Patent No.: US 6,812,794 B1
(45) Date of Patent: Nov. 2, 2004

(54) MULTISTAGE AMPLIFIER

(75) Inventors: Kazutomi Mori, Tokyo (JP); Shintarou Shinjo, Tokyo (JP); Fumimasa Kitabayashi, Tokyo (JP); Yukio Ikeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/936,212

(22) PCT Filed: Feb. 8, 2000

(86) PCT No.: PCT/JP00/00682

§ 371 (c)(1),
(2), (4) Date: Sep. 10, 2001

(87) PCT Pub. No.: WO01/59927

PCT Pub. Date: Aug. 16, 2001

(51) Int. Cl.[7] .............................. H03F 3/04; H03F 3/191
(52) U.S. Cl. ..................... 330/302; 330/306; 330/277; 330/310
(58) Field of Search ................................ 330/302, 303, 330/306, 310, 311, 277

(56) References Cited

U.S. PATENT DOCUMENTS 5,146,178 A    9/1992  Nojima et al. .............. 330/251
5,339,047 A *  8/1994  Mizan et al. ................ 330/286
5,379,294 A *  1/1995  Ohtake et al. .............. 370/295
6,330,165 B1 * 12/2001 Kohjiro et al. .............. 361/760

FOREIGN PATENT DOCUMENTS

| EP | 823779 | 11/1998 | |
| JP | 5894210 | 6/1983 | |
| JP | 07193465 A * | 7/1995 | H03H/11/28 |
| JP | 08330864 A * | 12/1996 | H03F/3/60 |
| JP | 1056339 | 2/1998 | |
| JP | 10-270960 A | 10/1998 | |
| JP | 2000-022461 A | 1/2000 | |

OTHER PUBLICATIONS

Nakahara et al., "900MHz–Band Low Voltage Drive Linear Amplifier Module", *Technical Report of IEICE*, vol. 95, No. 73, Jul. 1995, pp. 103–106 (English translation attached).

* cited by examiner

Primary Examiner—Terry D. Cunningham
Assistant Examiner—Quan Tra
(74) Attorney, Agent, or Firm—Birch, Stewart, Kolasch & Birch, LLP

(57) ABSTRACT

An inter-stage matching circuit 26 comprises a one-stage high pass filter type matching unit 28 and a one-stage low pass filter type matching unit 29 serially connected with each other.

28 Claims, 9 Drawing Sheets

FIG.2
CONVENTIONAL ART
(a)
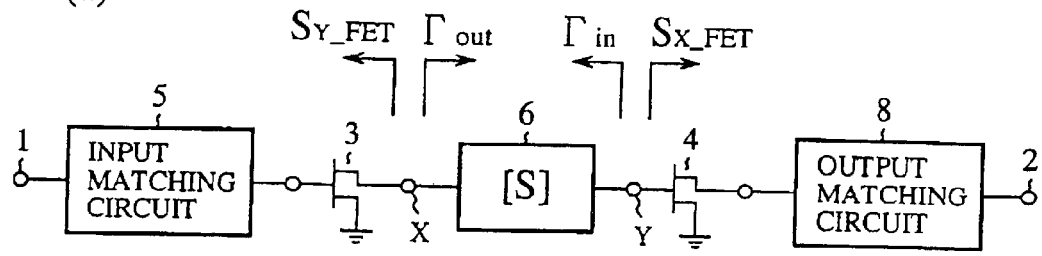
(b)
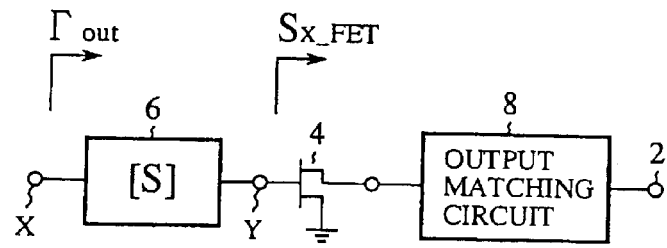
(c)
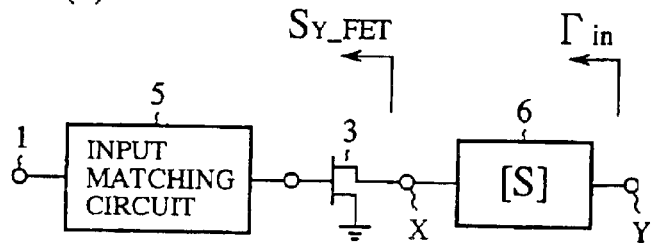

FIG. 4
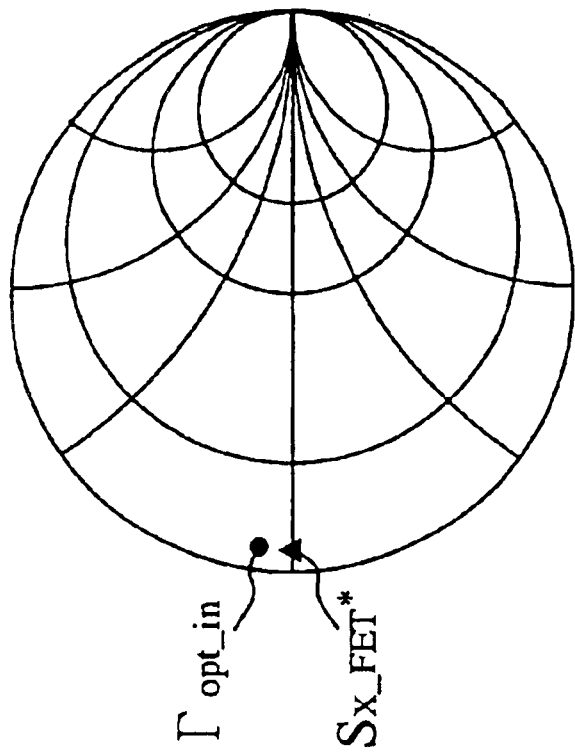
(b) $\Gamma_{in}$
$\Gamma_{opt\_in}$   $S_{X\_FET}^*$
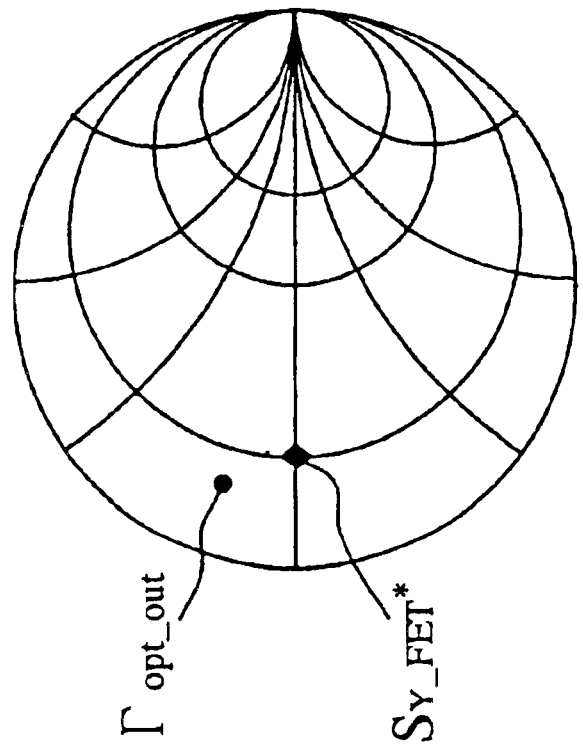
(a) $\Gamma_{out}$
$\Gamma_{opt\_out}$   $S_{Y\_FET}^*$

US 6,812,794 B1

MULTISTAGE AMPLIFIER

This application is the national phase under 35 U.S.C. §371 of PCT International Application No. PCT/JP00/00682 which has an International filing date of Feb. 8, 2000, which designated the United States of America.

TECHNICAL FIELD

The present invention relates to a multistage amplifier in which an input signal is amplified stage by stage and is output.

BACKGROUND ART

In a multistage amplifier using a type of semiconductor devices such as field effect transistors (FETs), bipolar junction transistors (BJTs) or hetero junction bipolar transistors (HBTs), an input matching circuit placed on an input side, an output matching circuit placed on an output side and an inter-stage matching circuit placed between the input matching circuit and the output matching circuit are generally arranged so as to bring out the performance of the type of semiconductor devices.

For example, FIG. 1 is a view of an equivalent circuit of a conventional multistage amplifier disclosed in "Technical Report of the Institute of Electronics, Information and Communication Engineers (IEICE), MW95-73", published in July of 1995. In FIG. 1, 1 indicates an input terminal for receiving a signal. 2 indicates an output terminal for outputting an amplified signal. 3 indicates a front-stage amplifying element for amplifying the signal received in the input terminal 1. 4 indicates a rear-stage amplifying element for amplifying the signal amplified in the front-stage amplifying element 3.

5 indicates an input matching circuit of the conventional multistage amplifier. 6 indicates an inter-stage matching circuit for performing an impedance matching between the front-stage amplifying element 3 and the rear-stage amplifying element 4. 7 indicates a bias circuit. 8 indicates an output matching circuit of the conventional multistage amplifier. 9 indicates a short stub for bias supply. 10 indicates a parallel capacitor. 11 indicates a serial line. 12 indicates a serial capacitor.

Here, each of the front-stage amplifying element 3 and the rear-stage amplifying element 4 is composed of an FET, a BJT, a metal oxide semiconductor field effect transistor (MOSFET), a high electron mobility transistor (HEMT) or an HBT.

Next, an operation will be described below.

When a signal is received in the input terminal 1, the signal is sent to the front-stage amplifying element 3 through the input matching circuit 5, and the signal is amplified in the front-stage amplifying element 3.

Thereafter, the signal amplified in the front-stage amplifying element 3 is sent to the rear-stage amplifying element 4 through the inter-stage matching circuit 6 and the bias circuit 7, and the signal is amplified in the rear-stage amplifying element 4.

Thereafter, the signal amplified in the rear-stage amplifying element 4 is output from the output terminal 2 through the output watching circuit 8.

Here, a function of the inter-stage matching circuit 6 will be described below.

In the inter-stage matching circuit 6, an impedance matching is performed on a certain reference plane between the front-stage amplifying element 3 and the rear-stage amplifying element 4 so as to make a pair of impedances conjugate to each other on both sides of the reference plane. FIG. 2 is an explanatory view showing a general example of matching conditions between the front-stage amplifying element 3 and the rear-stage amplifying element 4 of the conventional multistage amplifier.

As shown in FIG. 2, an output impedance of the front-stage amplifying element 3 is expressed by $S_{Y\_FET}$, an impedance (that is, an output load impedance of the front-stage amplifying element 3) on an output side seen from the front-stage amplifying element 3 is expressed by $F_{out}$, an input impedance of the rear-stage amplifying element 4 is expressed by $S_{X\_FET}$, an impedance (that is, an input source impedance of the rear-stage amplifying element 4) on an input side seen from the rear-stage amplifying element 4 is expressed by $F_{in}$.

In cases where a small signal operation is performed in the conventional multistage amplifier, an optimum output load impedance $\Gamma_{opt\_out}$ of the front-stage amplifying element 3 agrees with a conjugate complex impedance $S_{Y\_FET}{}^*$ of the output impedance $S_{Y\_FET}$ of the front-stage amplifying element 3, and an optimum input source impedance $\Gamma_{opt\_in}$ of the rear-stage amplifying element 4 agrees with a conjugate complex impedance $S_{X\_FET}{}^*$ of the input impedance $S_{X\_FET}$ of the rear-stage amplifying element 4.

Therefore, in cases where a conjugate complex impedance matching is performed at an output terminal X of the front-stage amplifying element 3, as shown in FIG. 2(b), the inter-stage matching circuit 6 is designed so as to perform an impedance transformation from the input impedance $S_{X\_FET}$ of the rear-stage amplifying element 4 to the conjugate complex impedance $S_{Y\_FET}{}^*$ of the output impedance $S_{Y\_FET}$ of the front-stage amplifying element 3.

Also, in cases where a conjugate complex impedance matching is performed at an input terminal Y of the rear-stage amplifying element 4, as shown in FIG. 2(c), the inter-stage matching circuit 6 is designed so as to perform an impedance transformation from the output impedance $S_{Y\_FET}$ of the front-stage amplifying element 3 to the conjugate complex impedance $S_{X\_FET}(=\Gamma_{opt\_in})$ of the input impedance $S_{X\_FET}$ of the rear-stage amplifying element 4.

Therefore, in cases where no loss occurs in the inter-stage matching circuit 6, when the conjugate complex impedance matching is performed at the output terminal X of the front-stage amplifying element 3, the conjugate complex impedance matching can be performed at the input terminal Y of the rear-stage amplifying element 4 simultaneously with the conjugate complex impedance matching at the output terminal X.

However, a level of the input signal transmitted through the multistage amplifier induces the conventional multistage amplifier to perform a large signal operation in a final-stage amplifying element or an amplifying element just before the final-stage amplifying element of the conventional multi-stage amplifier in place of the small signal operation.

In this case, the output impedance $S_{Y\_FET}$ of the front-stage amplifying element 3 and the input impedance $S_{X\_FET}$ of the rear-stage amplifying element 4 in the large signal operation of the conventional multistage amplifier differ from those in the small signal operation, and optimum impedances, which maximize an efficiency of the conventional multistage amplifier, differ from the input and output impedances $S_{X\_FET}$ and $S_{Y\_FET}$. Therefore, in the large signal operation, the optimum output load impedance $\Gamma_{opt\_out}$ of the front-stage amplifying element 3 differs from the conjugate complex impedance $S_{Y\_FET}{}^*$ of the output impedance $S_{Y\_FET}$ of the front-stage amplifying element 3, and the optimum input source impedance $\Gamma_{opt\_in}$ of the rear-stage amplifying element 4 differs from the conjugate complex impedance $S_{X\_FET}^*$ of the input impedance $S_{X\_FET}$ of the rear-stage amplifying element 4.

Therefore, in cases where a conjugate complex impedance matching is performed at the output terminal X of the front-stage amplifying element 3, as shown in FIG. 2(*b*), the inter-stage matching circuit 6 is designed so as to perform an impedance transformation from the input impedance $S_{X\_FET}$ of the rear-stage amplifying element 4 to the optimum output load impedance $\Gamma_{opt\_out}$ ($\neq S_{X\_FET}^*$) of the front-stage amplifying element 3. Also, in cases where a conjugate complex impedance matching is performed at the input terminal Y of the rear-stage amplifying element 4, as shown in FIG. 2(*c*), the inter-stage matching circuit 6 is designed so as to perform an impedance transformation from the output impedance $S_{Y\_FET}$ of the front-stage amplifying element 3 to the optimum input source impedance $\Gamma_{opt\_in}$ ($\approx S_{X\_FET}^*$) of the rear-stage amplifying element 4.

In this case, it is impossible for the inter-stage matching circuit 6 to perform the conjugate complex impedance matching at the output terminal X of the front-stage amplifying element 3 simultaneously with the conjugate complex impedance matching at the input terminal Y of the rear-stage amplifying element 4.

Because the conventional multistage amplifier has the above described configuration, it is impossible to perform the matching of the output load impedance $F_{out}$ of the front-stage amplifying element 3 with the optimum output load impedance $\Gamma_{opt\_out}$ simultaneously with the matching of the input source impedance $F_{in}$ of the rear-stage amplifying element 4 with the optimum input source impedance $\Gamma_{opt\_in}$. Therefore, a problem has arisen that an efficiency of the whole conventional multistage amplifier is lowered.

The present invention is provided to solve the above-described problem, and the object of the present invention is to provide a multistage amplifier in which an output load impedance of a front-stage amplifying element and an input source impedance of a rear-stage amplifying element are simultaneously matched with optimum impedances respectively.

SUMMARY OF THE INVENTION

A multistage amplifier according to the present invention has a matching circuit comprising a one-stage high pass filter type matching unit and a one-stage low pass filter type matching unit serially connected with the one-stage high pass filter type matching unit.

Therefore, because an output load impedance of a front-stage amplifying element and an input source impedance of a rear-stage amplifying element can be matched with the optimum impedances respectively, an efficiency of the whole multistage amplifier can be heightened.

In the multistage amplifier according to the present invention, the matching circuit arranged between the final-stage amplifying element and the amplifying element placed just before the final-stage amplifying element comprises the one-stage high pass filter type matching unit and the one-stage low pass filter type matching unit serially connected with each other.

Therefore, a small-sized multistage amplifier can be obtained.

In the multistage amplifier according to the present invention, the one-stage high pass filter type matching unit is placed on an input side of the input signal, and the one-stage low pass filter type matching unit is placed on an output side of the amplified signal.

Therefore, an output load impedance of a front-stage amplifying element and an input source impedance of a rear-stage amplifying element can be watched with the optimum impedances respectively.

In the multistage amplifier according to the present invention, the one-stage low pass filter type matching unit is placed on an input side of the input signal, and the one-stage high pass filter type matching unit is placed on an output side of the amplified signal.

Therefore, an output load impedance of a front-stage amplifying element and an input source impedance of a rear-stage amplifying element can be matched with the optimum impedances respectively.

In the multistage amplifier according to the present invention, the one-stage high pass filter type matching unit comprises a parallel inductor and a serial capacitor.

Therefore, a small-sized one-stage high pass filter type matching unit can be obtained.

In the multistage amplifier according to the present invention, a bias supply short stub having a length equal to or shorter than ¼ of a wavelength of the input signal is used as the parallel inductor.

Therefore, because the bias supply short stub can be used as a bias supply line on an output side of the front-stage amplifying element, a small-sized multistage amplifier can be obtained.

In the multistage amplifier according to the present invention, the one-stage low pass filter type matching unit comprises a parallel capacitor and a serial inductor.

Therefore, a small-sized one-stage low pass filter type matching unit can be obtained.

In the multistage amplifier according to the present invention, a serial line is used as the serial inductor.

Therefore, a small-sized one-stage low pass filter type matching unit can be obtained.

BRIEF DESCRIPTION OF THE DRAWINGS

FIG. 2 is an explanatory view showing a general example of matching conditions between a front-stage amplifying element and a rear-stage amplifying element of the conventional multistage amplifier.

FIG. 4 is an explanatory view showing an optimum output load impedance of a front-stage amplifying element and an optimum input source impedance of a rear-stage amplifying element.

DETAILED DESCRIPTION OF THE INVENTION

Hereinafter, the best mode for carrying out the present invention will now be described with reference to the accompanying drawings to explain the present invention in more detail.

Embodiment 1

Figure 3:
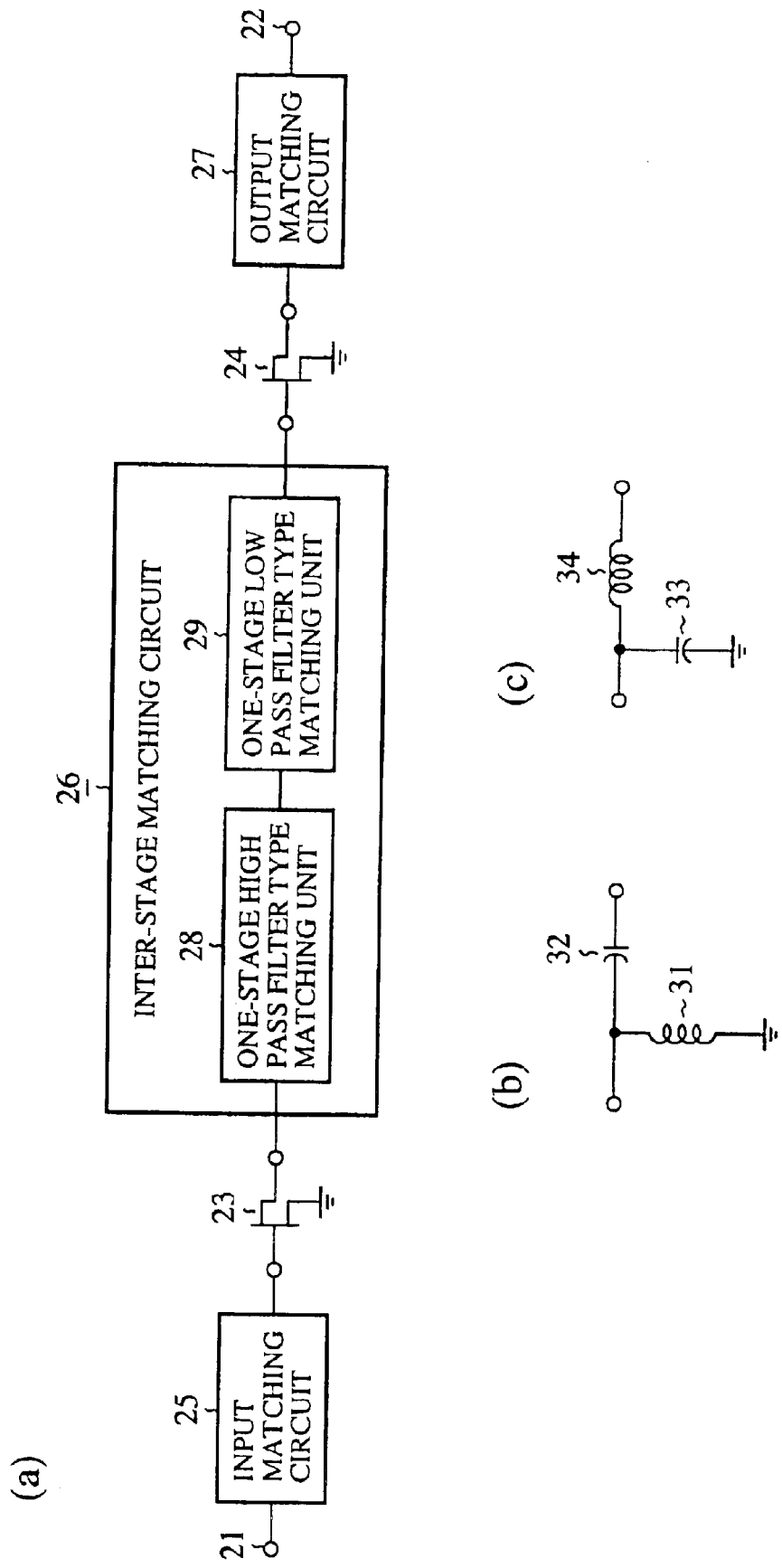
FIG. 3 is a view of an equivalent circuit of a multistage amplifier according to a first embodiment of the present invention.

FIG. 3 is a view of an equivalent circuit of a multistage amplifier according to a first embodiment of the present invention.

In FIG. 3, 21 indicates an input terminal for receiving a signal. 22 indicates an output terminal for outputting an amplified signal. 23 indicates a front-stage amplifying element for amplifying the signal received in the input terminal 21. 24 indicates a rear-stage amplifying element for amplifying the signal amplified in the front-stage amplifying element 23.

25 indicates an input matching circuit of the multistage amplifier. 26 indicates an inter-stage matching circuit for performing an impedance matching between the front-stage amplifying element 23 and the rear-stage amplifying element 24. 27 indicates an output matching circuit of the multistage amplifier. 28 indicates a one-stage high pass filter type matching unit of the inter-stage matching circuit 26. 29 indicates a one-stage low pass filter type matching unit of the inter-stage matching circuit 26.

31 indicates a parallel inductor of the one-stage high pass filter type matching unit 28. 32 indicates a serial capacitor of the one-stage high pass filter type matching unit 28. 33 indicates a parallel capacitor of the one-stage low pass filter type matching unit 29. 34 indicates a serial inductor of the one-stage low pass filter type matching unit 29.

Here, each of the front-stage amplifying element 23 and the rear-stage amplifying element 24 is composed of an FET, a BJT, an MOSFET, an HEMT or an HBT.

Next, an operation of the multistage amplifier will be described below.

When a signal is received in the input terminal 21, the signal is sent to the front-stage amplifying element 23 through the input matching circuit 25, and the signal is amplified in the front-stage amplifying element 23.

Thereafter, the signal amplified in the front-stage amplifying element 23 is sent to the rear-stage amplifying element 24 through the inter-stage matching circuit 26 comprising the one-stage high pass filter type matching unit 28 and the one-stage low pass filter type matching unit 29, and the signal is amplified in the rear-stage amplifying element 24.

Thereafter, the signal amplified in the rear-stage amplifying element 24 is output from the output terminal 22 through the output matching circuit 27.

Here, a high electron mobility transistor (HEMT) element having a gate width of 5.8 mm is, for example, used as the front-stage amplifying element 23, an optimum output load impedance $\Gamma_{opt\_out}$ of the HEMT element and a conjugate complex impedance $S_{Y\_FET}^*$ of an output impedance of the HEMT element are shown in FIG. 4(a).

Also, a high electron mobility transistor (HEMT) element having a gate width of 17.5 mm is, for example, used as the rear-stage amplifying element 24, an optimum input source impedance $\Gamma_{opt\_in}$ of the HEMT element and a conjugate complex impedance $S_{X\_FET}^*$ of an input impedance of the HEMT element are shown in FIG. 4(b).

Bias conditions for the HEMT elements are Class-AB together. In this case, the gate width of the front-stage amplifying element 23 is equal to or lower than a half of the gate width of the rear-stage amplifying element 24.

The optimum input source impedance $\Gamma_{opt\_in}$ the rear-stage amplifying element 24 (the HEMT element of the gate width of 17.5 mm) corresponds to an impedance, at which a maximum efficiency is obtained in the multistage amplifier, in cases where a prescribed distortion condition is satisfied at an output electric power level of almost 3 dB in back off, and the optimum input source impedance $\Gamma_{opt\_in}$ is determined by performing load-pull and source-pull measurements.

The optimum output load impedance $\Gamma_{opt\_out}$ of the front-stage amplifying element 23 (the HEMT element of the gate width of 5.8 mm) is determined by examining various combinations of characteristics of the front-stage amplifying element 23 and the rear-stage amplifying element 24 according to both a result of load-pull and source-pull measurements for the HEMT element of the gate width of 5.8 mm and the result of the load-pull and source-pull measurements for the HEMT element of the gate width of 17.5 mm, determining a specific combination of characteristics of the front-stage amplifying element 23 and the rear-stage amplifying element 24 on condition that a maximum efficiency in the multistage amplifier is obtained in cases where a prescribed distortion condition is satisfied as a two-stage amplifier at an output electric power level of almost 3 dB ir back off and adopting an output load impedance of the front-stage amplifying element 23 determined in the specific combination as the optimum output load impedance $\Gamma_{opt\_out}$.

As shown in FIG. 4(a), a real part of the optimum output load impedance $\Gamma_{opt\_out}$ of the front-stage amplifying element 23 (the HEMT element of the gate width of 5.8 mm) is moved toward a low impedance direction as compared with the conjugate complex impedance $S_{Y\_FET}^*$ of the output impedance of the front-stage amplifying element 23, and an imaginary part of the optimum output load impedance $\Gamma_{opt\_out}$ of the front-stage amplifying element 23 is moved toward an inductive direction as compared with the conjugate complex impedance $S_{Y\_FET}^*$ of the output impedance of the front-stage amplifying element 23.

Also, as shown in FIG. 4(b), a real part of the optimum input source impedance $\Gamma_{opt\_in}$ of the rear-stage amplifying element 24 (the HEMT element of the gate width of 17.5 mm) is moved toward a high impedance direction as compared with the conjugate complex impedance $S_{X\_FET}^*$ of the input impedance of the rear-stage amplifying element 24, and an imaginary part of the optimum input source impedance $\Gamma_{opt\_in}$ of the rear-stage amplifying element 24 is moved toward an inductive direction as compared with the conjugate complex impedance $S_{X\_FET}^*$ of the input impedance of the rear-stage amplifying element 24.

Figure 5:
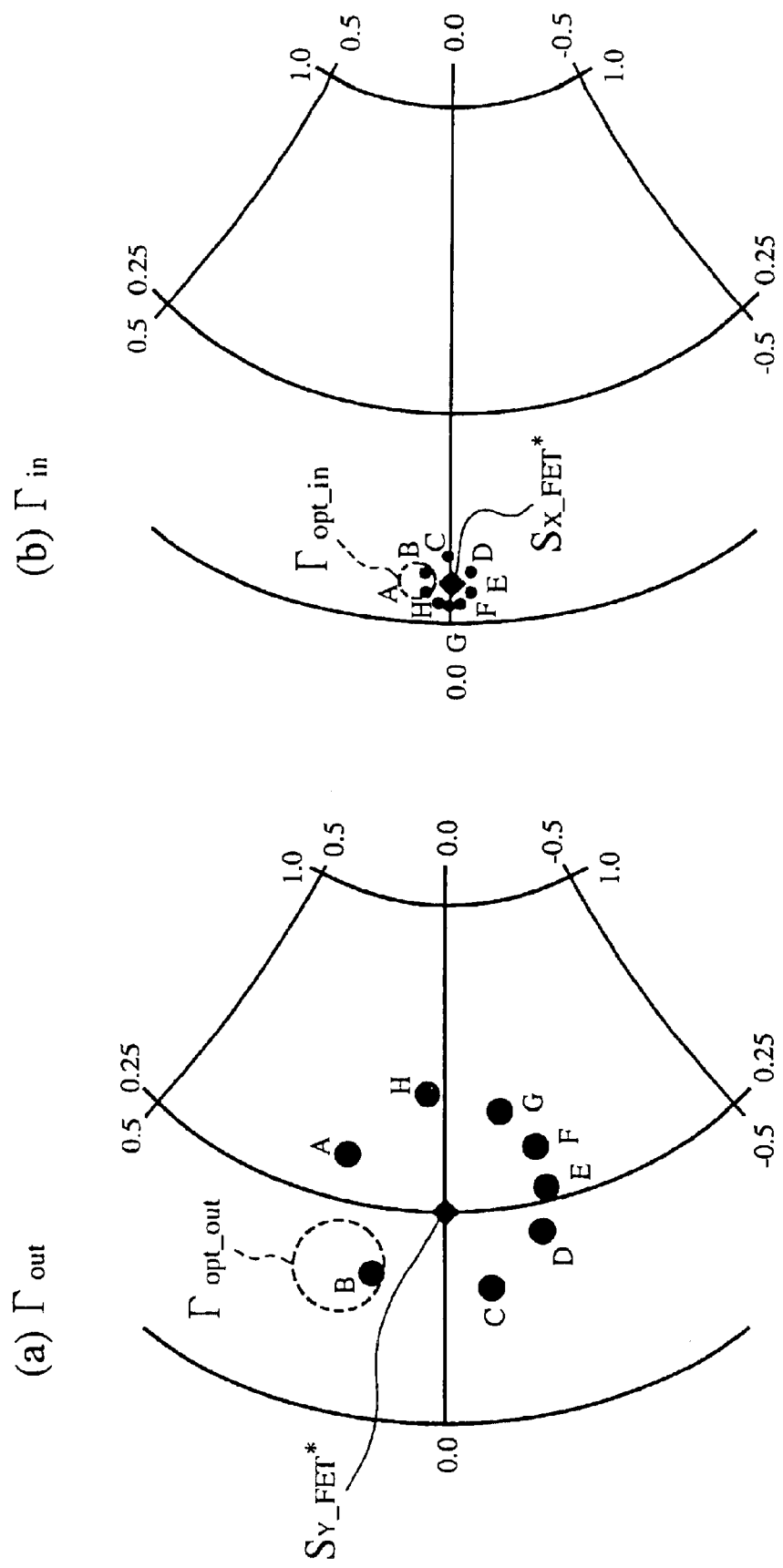
FIG. 5 is an explanatory view showing impedances between a front-stage amplifying element and a rear-stage amplifying element in cases where an inter-stage matching circuit comprises a one-stage high pass filter type matching unit and a one-stage low pass filter type matching unit.

Next, an output load impedance $\Gamma_{out}$ of the front-stage amplifying element 23 and an input source impedance $\Gamma_{in}$ of the rear-stage amplifying element 24 are shown in FIG. 5 in cases where the inter-stage matching circuit 26 comprising the one-stage high pass filter type matching unit 28 and the one-stage low pass filter type matching unit 29 is used for the multistage amplifier.

In FIG. 5(a) and FIG. 5(b), impedances designated by symbols ♦ indicate the conjugate complex impedance $S_{Y\_FET}^*$ of the output impedance of the front-stage amplifying element 23 and the conjugate complex impedance $S_{X\_FET}^*$ of the input impedance of the rear-stage amplifying element 24 respectively, an area enclosed by a dotted circle in FIG. 5(*a*) indicates a neighboring area of the optimum output load impedance $\Gamma_{opt\_out}$ shown in FIG. 4(*a*), and an area enclosed by a dotted circle in FIG. 5(*b*) indicates a neighboring area of the optimum input source impedance $\Gamma_{opt\_in}$ shown in FIG. 4(*b*).

Here, in cases where the inter-stage matching circuit 26 comprising the one-stage high pass filter type matching unit 28 and the one-stage low pass filter type matching unit 29 is used for the multistage amplifier, the output load impedance $\Gamma_{out}$ of the front-stage amplifying element 23 is examined when the input source impedance $\Gamma_{in}$ of the rear-stage amplifying element 24 is matched with an impedance differing from the conjugate complex impedance $S_{X\_FET}^*$ of the input impedance of the rear-stage amplifying element 24.

For example, in cases where the inter-stage matching circuit 26 is arranged in the multistage amplifier so as to match the input source impedance $\Gamma_{in}$ of the rear-stage amplifying element 24 with an impedance indicated by an "A" symbol ● of FIG. 5(*b*), the output load impedance $\Gamma_{out}$ of the front-stage amplifying element 23 is set to an impedance indicated by an "A" symbol ● of FIG. 5(*a*).

Also, in the same manner as the example of the impedance indicated by the "A" symbol ●, the output load impedance $\Gamma_{out}$ of the front-stage amplifying element 23 is set to an impedance indicated by each of the "B" to "H" symbols ● of FIG. 5(*a*) when the input source impedance $\Gamma_{in}$ of the rear-stage amplifying element 24 is matched with an impedance indicated by the corresponding symbol ● of FIG. 5(*b*).

As is described above, when the input source impedance $\Gamma_{in}$ of the rear-stage amplifying element 24 is matched with the impedance of each of the "A" to "H" symbols ● placed on a circle in FIG. 5(*b*), the output load impedance $\Gamma_{out}$ of the front-stage amplifying element 23 is set to the impedance of the corresponding symbol selected from the "A" to "H" symbols ● placed on a circle in FIG. 5(*a*). In particular, in case of the impedance of the "B" symbols, as shown in FIG. 5(*a*) and FIG. 5(*b*), the input source impedance $\Gamma_{in}$ of the rear-stage amplifying element 24 is placed in the neighboring area of the optimum input source impedance $\Gamma_{opt\_in}$ of the rear-stage amplifying element 24, and the output load impedance $\Gamma_{out}$ of the front-stage amplifying element 23 is placed in the neighboring area of the optimum output load impedance $\Gamma_{opt\_out}$ of the front-stage amplifying element 23.

Accordingly, in cases where the inter-stage matching circuit 26 comprises the one-stage high pass filter type matching unit 28 and the one-stage low pass filter type matching unit 29, the output load impedance $\Gamma_{out}$ of the front-stage amplifying element 23 can almost agree with the optimum output load impedance $\Gamma_{opt\_out}$, and the input source impedance $\Gamma_{in}$ of the rear-stage amplifying element 24 can almost agree with the optimum input source impedance $\Gamma_{opt\_in}$.

Therefore, because an inter-stage matching condition of the multistage amplifier can be further optimized, the efficiency of the whole multistage amplifier can be heightened.

Here, assuming that the inter-stage matching circuit 26 has only a one-stage low pass filter type matching unit, a one-stage high pass filter type matching unit, a two-stage low pass filter type matching unit or a two-stage high pass filter type matching unit, even though the inter-stage matching circuit 26 is arranged in the multistage amplifier so as to match the input source impedance $\Gamma_{in}$ of the rear-stage amplifying element 24 with the impedance of the "B" symbol ● placed in the neighboring area of the optimum input source impedance $\Gamma_{opt\_in}$, the output load impedance $\Gamma_{out}$ of the front-stage amplifying element 23 is set to an impedance considerably differing from the impedance of the "B" symbols shown in FIG. 5(*a*). Therefore, the output load impedance $\Gamma_{out}$ of the front-stage amplifying element 23 cannot agree with the optimum output load impedance $\Gamma_{opt\_out}$. Also, in the same manner, the input source impedance $\Gamma_{in}$ of the rear-stage amplifying element 24 cannot agree with the optimum input source impedance $\Gamma_{opt\_in}$.

Figure 1:
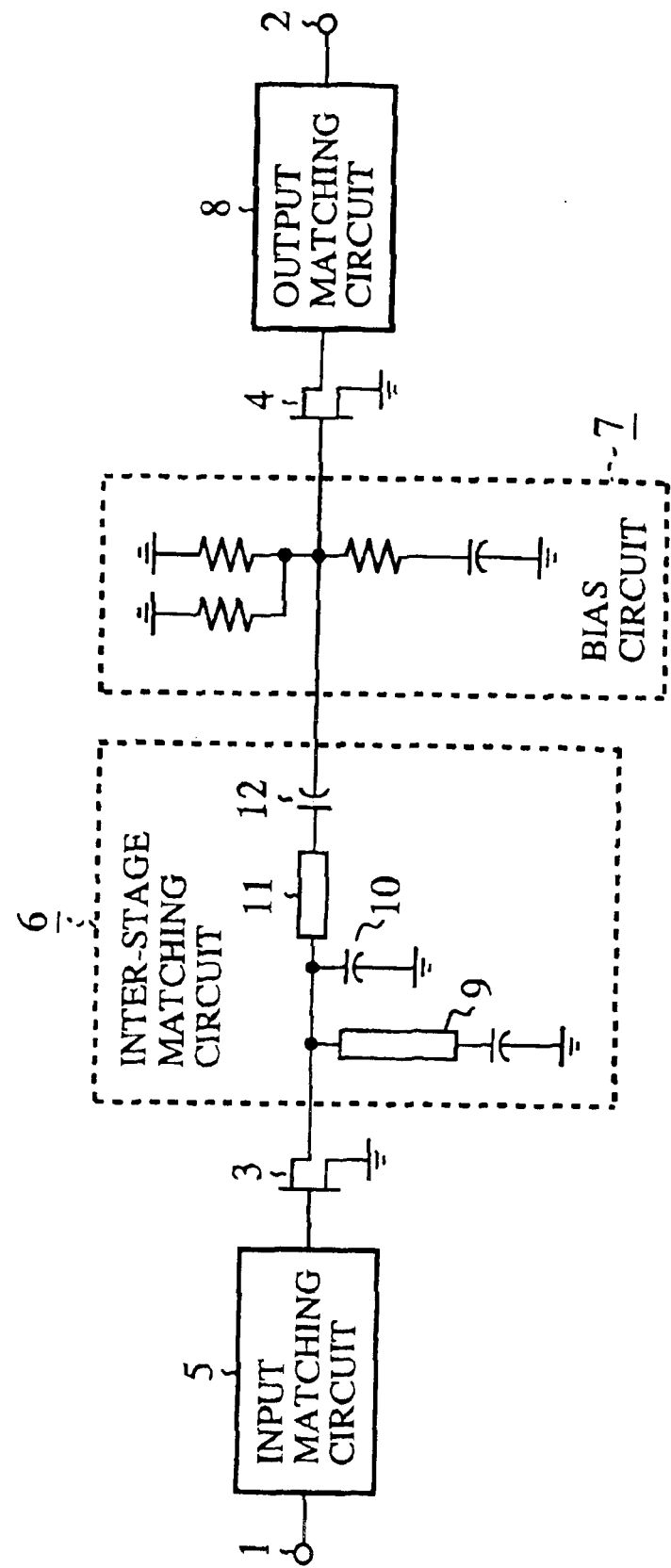
FIG. 1 is a view of an equivalent circuit of a conventional multistage amplifier.

In case of the prior art shown in FIG. 1, to exert no influence of the short tub 9 or the serial capacitor 12 on the impedances at an operation frequency of the input signal, the short tub 9 for bias supply has a length near to ¼ of a wavelength of the input signal, and the serial capacitor 12 has a sufficiently high capacitance. Therefore, the inter-stage matching circuit 6 substantially composed of the parallel capacitor 10 and the serial line 11 functions as one-stage low pass filter type matching unit. Accordingly, the output load impedance $\Gamma_{out}$ of the front-stage amplifying element 3 cannot agree with the optimum output load impedance $\Gamma_{opt\_out}$, and the input source impedance $\Gamma_{in}$ of the rear-stage amplifying element 4 cannot agree with the optimum input source impedance $\Gamma_{opt\_in}$.

In the first embodiment, the multistage amplifier corresponding to two stages (the front-stage amplifying element 23 and the rear-stage amplifying element 24) is described. However, it is applicable that the multistage amplifier have three stages or more. In case of the multistage amplifier having three stages or more, an inter-stage matching circuit 26 (hereinafter, called a final inter-stage matching circuit) between an amplifying element of a final stage and an amplifying element of a stage just before the final stage comprises the one-stage high pass filter type matching unit 28 and the one-stage low pass filter type matching unit 29. In this case, even though an inter-stage matching circuit existing in the input-side direction from the final inter-stage matching circuit 26 does not have both the one-stage high pass filter type matching unit 28 and the one-stage low pass filter type matching unit 29, the same effect as that of the first embodiment can be obtained in the multistage amplifier having three stages or more.

Therefore, because a small-sized matching circuit such as a one-stage low pass filter type matching unit can be used as an inter-stage matching circuit existing in the input-side direction from the final inter-stage matching circuit 26, a small-sized multistage amplifier can be obtained.

Embodiment 2

Figure 6:
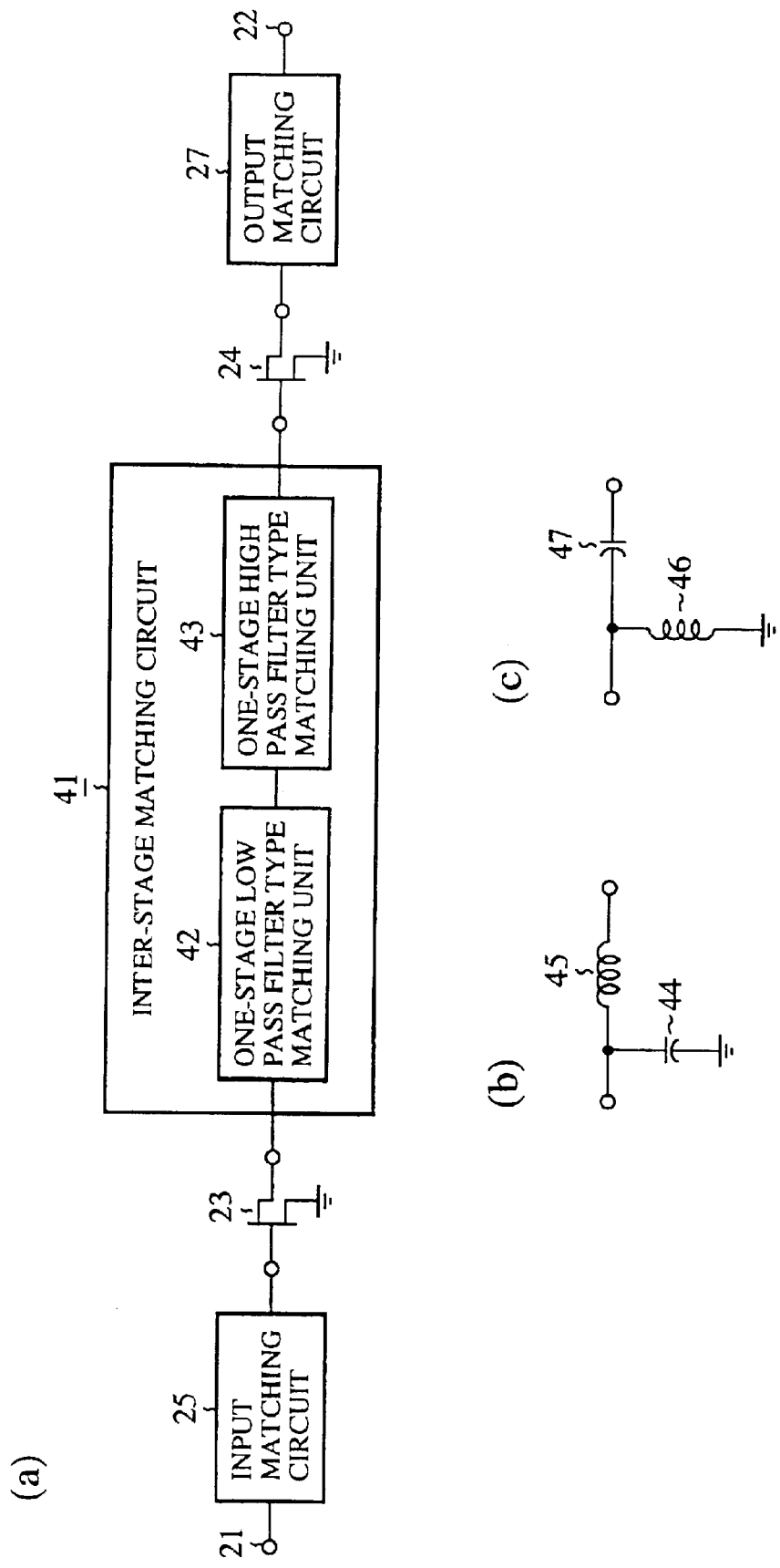
FIG. 6 is a view of an equivalent circuit of a multistage amplifier according to a second embodiment of the present invention.

FIG. 6 is a view of an equivalent circuit of a multistage amplifier according to a second embodiment of the present invention. In FIG. 6, the constituent elements, which are the same as or equivalent to those shown in FIG. 3, are indicated by the same reference numerals as those of the constituent elements shown in FIG. 3, and additional description of those constituent elements is omitted.

41 indicates an inter-stage matching circuit for performing an impedance matching between the front-stage amplifying element 23 and the rear-stage amplifying element 24. 42 indicates a one-stage low pass filter type matching unit of the inter-stage matching circuit 41. 43 indicates a one-stage high pass filter type matching unit of the inter-stage matching circuit 41.

44 indicates a parallel capacitor of the one-stage low pass filter type matching unit 42. 45 indicates a serial inductor of the one-stage low pass filter type matching unit 42. 46 indicates a parallel inductor of the one-stage high pass filter type matching unit 43. 47 indicates a serial capacitor of the one-stage high pass filter type matching unit 43.

Next, an operation of the multistage amplifier will be described below.

In the first embodiment, the inter-stage matching circuit 26 comprises the one-stage high pass filter type matching unit 28 arranged on the input side and the one-stage low pass filter type matching unit 29 arranged on the output side. However, in the second embodiment, the inter-stage matching circuit 41 comprises the one-stage low pass filter type matching unit 42 arranged on the input side and the one-stage high pass filter type matching unit 43 arranged on the output side. The inter-stage matching circuit 41 will be described below in detail.

Figure 7:
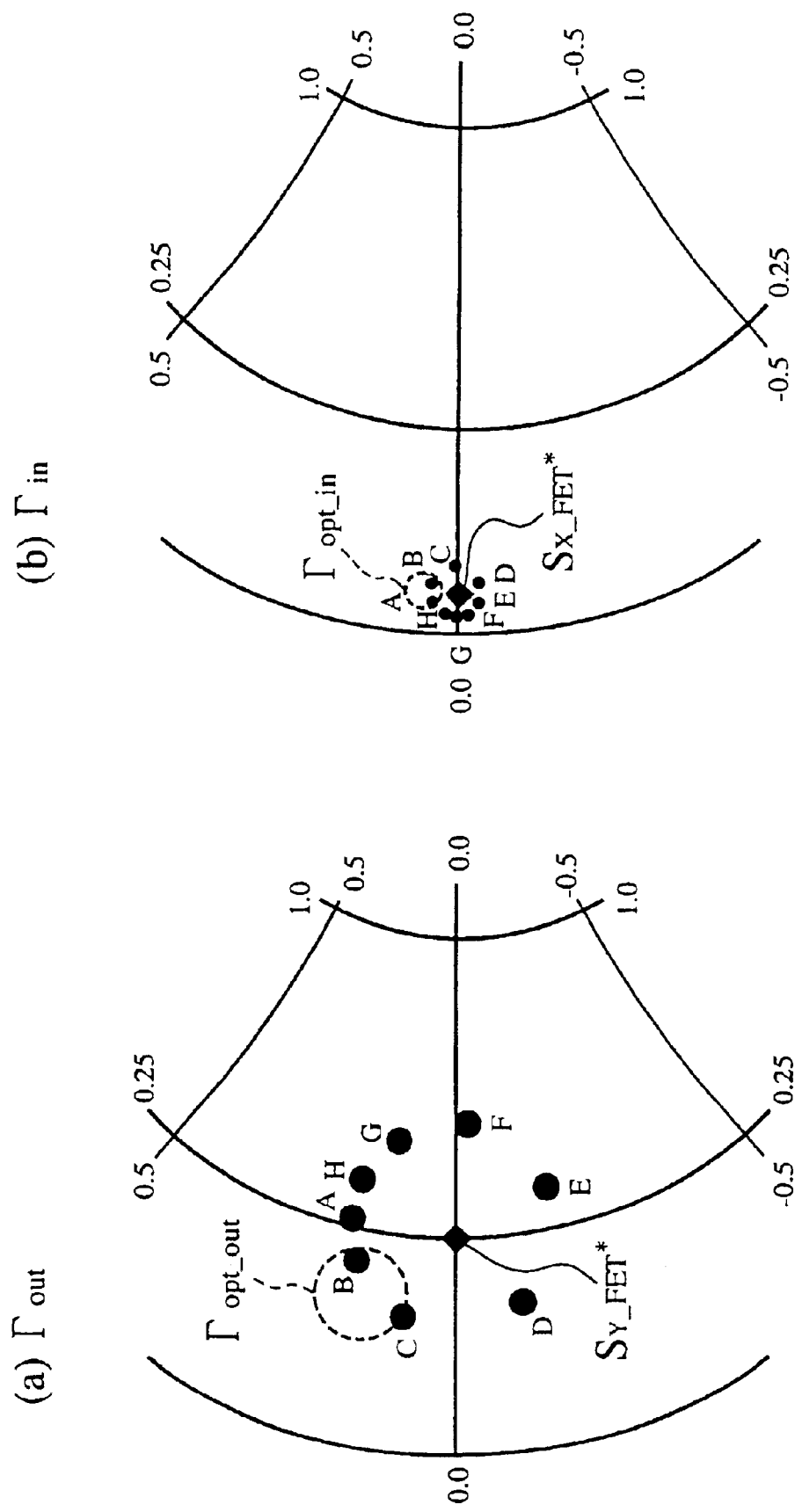
FIG. 7 is an explanatory view showing impedances in an inter-stage matching circuit in cases where the inter-stage matching circuit comprises a one-stage low pass filter type matching unit and a one-stage high pass filter type matching unit.

An output load impedance $\Gamma_{out}$ of the front-stage amplifying element 23 and an input source impedance $\Gamma_{in}$ of the rear-stage amplifying element 24 are shown in FIG. 7 in cases where the inter-stage matching circuit 41 comprising the one-stage low pass filter type matching unit 42 and the one-stage high pass filter type matching unit 43 is used for the multistage amplifier.

In FIG. 7(a) and FIG. 7(b), impedances designated by symbols ♦ indicate the conjugate complex impedance $S_{Y\_FET}*$ of the output impedance of the front-stage amplifying element 23 and the conjugate complex impedance $S_{X\_FET}*$ of the input impedance of the rear-stage amplifying element 24 respectively, an area enclosed by a dotted circle in FIG. 7(a) indicates a neighboring area of the optimum output load impedance $\Gamma_{opt\_out}$ shown in FIG. 4(a), and an area enclosed by a dotted circle in FIG. 7(b) indicates a neighboring area of the optimum input source impedance $\Gamma_{opt\_in}$ shown in FIG. 4(b).

Here, in cases where the inter-stage matching circuit 41 comprising the one-stage low pass filter type matching unit 42 and the one-stage high pass filter type matching unit 43 is used for the multistage amplifier, the output load impedance $\Gamma_{out}$ of the front-stage amplifying element 23 is examined when the input source impedance $\Gamma_{in}$ of the rear-stage amplifying element 24 is matched with an impedance differing from the conjugate complex impedance $S_{X\_FET}*$ of the input impedance of the rear-stage amplifying element 24.

For example, in cases where the inter-stage matching circuit 41 is arranged in the multistage amplifier so as to match the input source impedance $\Gamma_{in}$ of the rear-stage amplifying element 24 with an impedance indicated by an "A" symbol ● of FIG. 7(b), the output load impedance $\Gamma_{out}$ of the front-stage amplifying element 23 is set to an impedance indicated by an "A" symbol ● of FIG. 7(a).

Also, in the same manner as the example of the impedance indicated by the "A" symbol ●, the output load impedance $\Gamma_{out}$ of the front-stage amplifying element 23 is set to an impedance indicated by each of the "B" to "H" symbols ● of FIG. 7(a) when the input source impedance $\Gamma_{in}$ of the rear-stage amplifying element 24 is matched with an impedance indicated by the corresponding symbol ● of FIG. 7(b).

As is described above, when the input source impedance $\Gamma_{in}$ of the rear-stage amplifying element 24 is matched with the impedance of each of the "A" to "H" symbols ● placed on a circle in FIG. 7(b), the output load impedance $\Gamma_{out}$ of the front-stage amplifying element 23 is set to the impedance of the corresponding symbol selected from the "A" to "H" symbols ● placed on a circle in FIG. 7(a). In particular, in case of the impedance of the "B" symbol ●, as shown in FIG. 5(a) and FIG. 5(b), the input source impedance $\Gamma_{in}$ of the rear-stage amplifying element 24 is placed in the neighboring area of the optimum input source impedance $\Gamma_{opt\_in}$ of the rear-stage amplifying element 24, and the output load impedance $\Gamma_{out}$ of the front-stage amplifying element 23 is placed in the neighboring area of the optimum output load impedance $\Gamma_{opt\_out}$ of the front-stage amplifying element 23.

Accordingly, in cases where the inter-stage matching circuit 41 comprises the one-stage low pass filter type matching unit 42 and the one-stage high pass filter type matching unit 43, the output load impedance $\Gamma_{out}$ of the front-stage amplifying element 23 can almost agree with the optimum output load impedance $\Gamma_{opt\_out}$, and the input source impedance $\Gamma_{in}$ of the rear-stage amplifying element 24 can almost agree with the optimum input source impedance $\Gamma_{opt\_in}$.

Therefore, because an inter-stage matching condition of the multistage amplifier can be further optimized, the efficiency of the whole multistage amplifier can be heightened.

Embodiment 3

Figure 8:
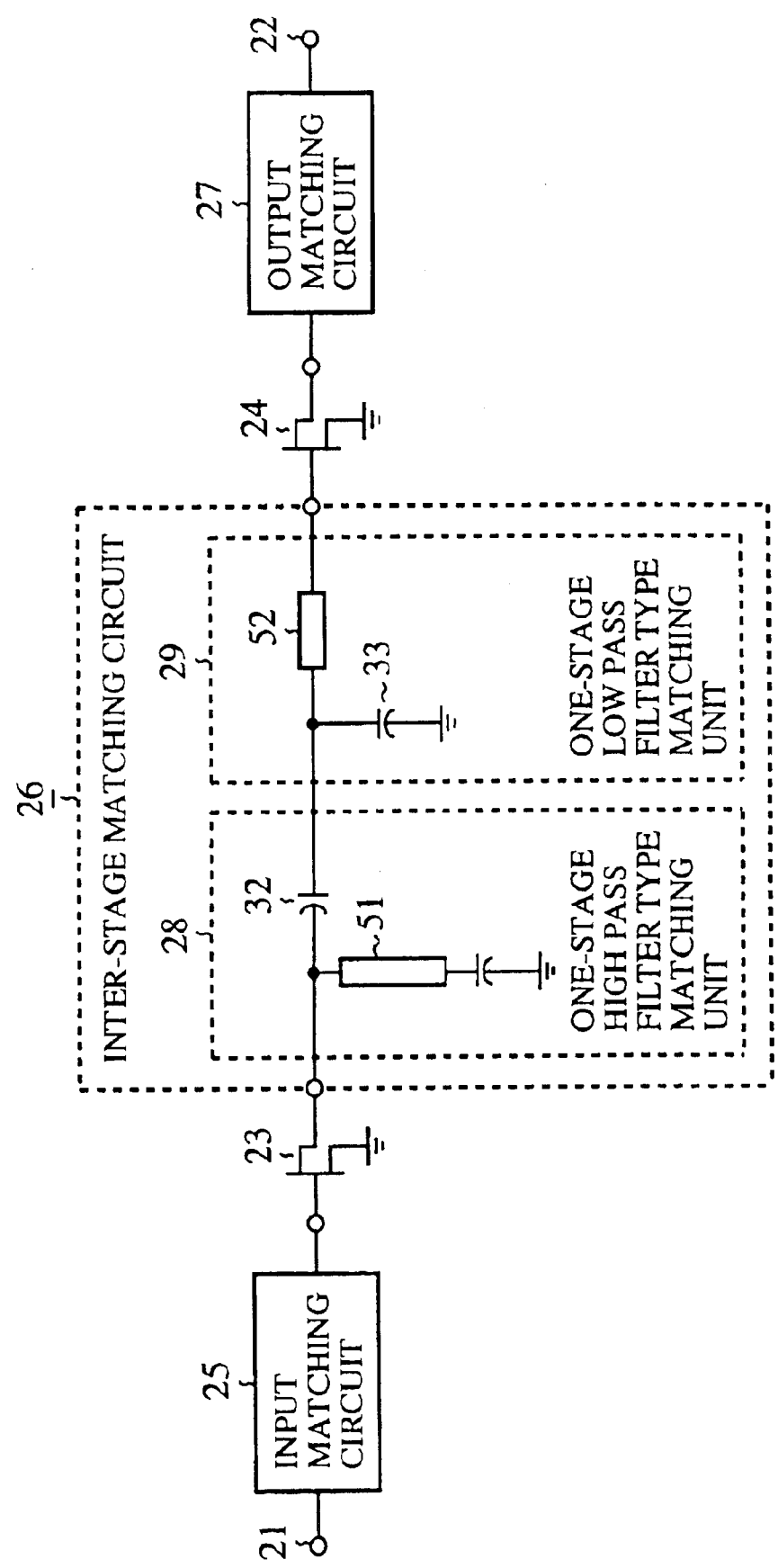
FIG. 8 is a view of an equivalent circuit of a multistage amplifier according to a third embodiment of the present invention.

FIG. 8 is a view of an equivalent circuit of a multistage amplifier according to a third embodiment of the present invention. In FIG. 8, the constituent elements, which are the same as or equivalent to those shown in FIG. 3, are indicated by the same reference numerals as those of the constituent elements shown in FIG. 3, and additional description of those constituent elements is omitted.

51 indicates a bias supply short stub of the one-stage high pass filter type matching unit 28. A length of the bias supply short stub 51 is equal to or shorter than ¼ of a wavelength of the signal. 52 indicates a serial line of the one-stage low pass filter type matching unit 29.

Next, an operation of the multistage amplifier will be described below.

In the first embodiment, the one-stage high pass filter type matching unit 28 comprises the parallel inductor 31 and the serial capacitor 32, and the one-stage low pass filter type matching unit 29 comprises the parallel capacitor 33 and the serial inductor 34. However, in the third embodiment, the one-stage high pass filter type matching unit 28 comprises the bias supply short stub 51 having the length equal to or shorter than ¼ of the wavelength of the signal in place of the parallel inductor 31, and the one-stage low pass filter type matching unit 29 comprises the serial line 52 in place of the serial inductor 34.

In cases where a parallel short stub has a length equal to or shorter than ¼ of the wavelength of the signal, the parallel short stub has the same electric characteristic as that of a parallel inductor. Also, a serial line has the same electric characteristic as that of a serial inductor.

Accordingly, because the inter-sage matching circuit 26 of the multistage amplifier comprises the one-stage high pass filter type matching unit 28 having the bias supply short stub 51 and the one-stage low pass filter type matching unit 29 having the serial line 52, the output load impedance $\Gamma_{out}$ of the front-stage amplifying element 23 can almost agree with the optimum output load impedance $\Gamma_{opt\_out}$, and the input source impedance $\Gamma_{in}$ of the rear-stage amplifying element 24 can almost agree with the optimum input source impedance $\Gamma_{opt\_in}$.

Therefore, because an inter-stage matching condition of the multistage amplifier can be further optimized, the efficiency of the whole multistage amplifier can be heightened.

Also, because the one-stage high pass filter type matching unit 28 comprises the bias supply short stub 51 having the length equal to or shorter than ¼ of the wavelength of the signal in place of the parallel inductor 31, the bias supply short stub 51 can be used as a bias supply line placed on the output side of the front-stage amplifying element 23. Therefore, a small-sized multistage amplifier can be obtained.

Embodiment 4

Figure 9:
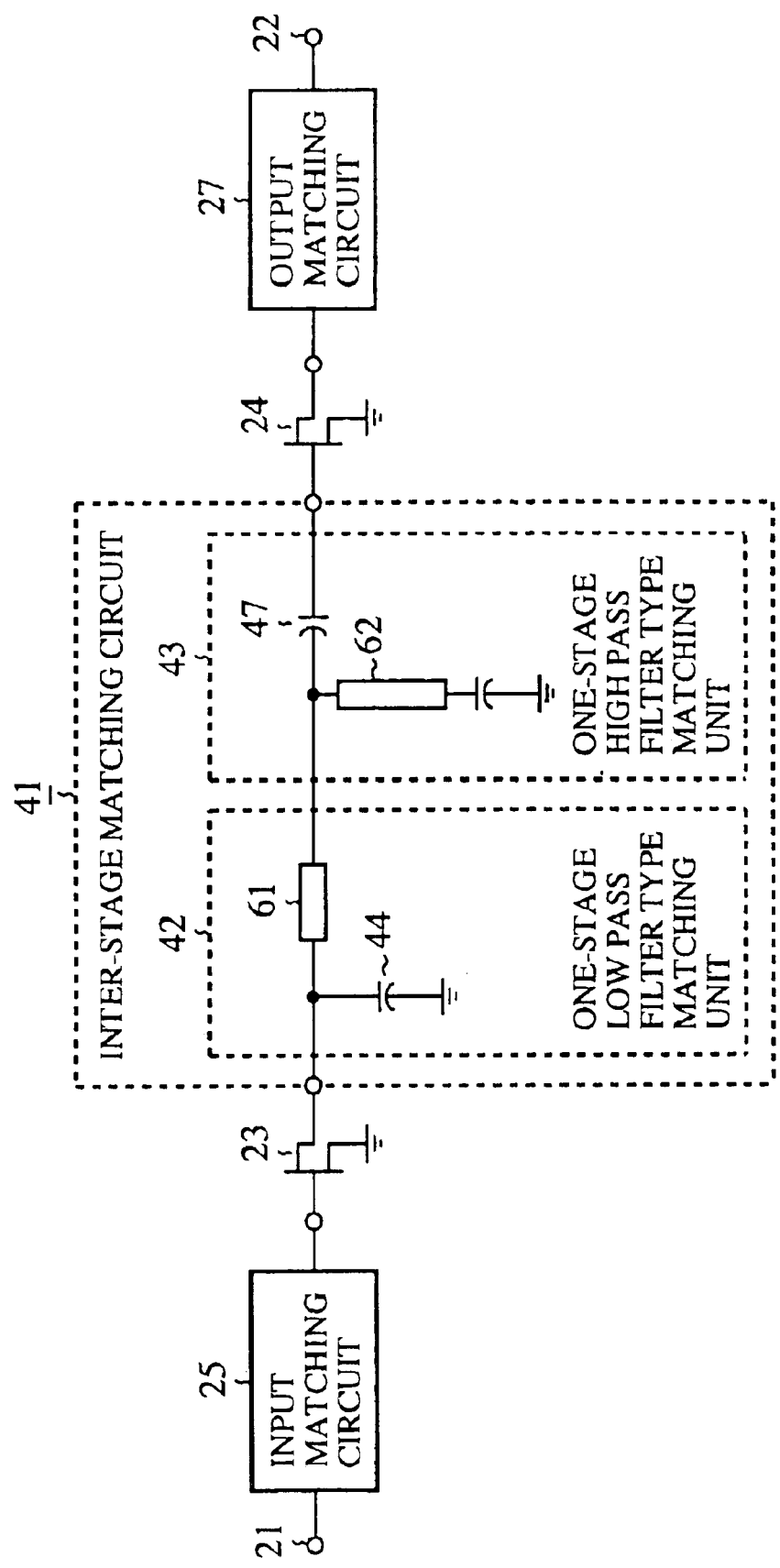
FIG. 9 is a view of an equivalent circuit of a multistage amplifier according to a fourth embodiment of the present invention.

FIG. 9 is a view of an equivalent circuit of a multistage amplifier according to a fourth embodiment of the present invention. In FIG. 9, the constituent elements, which are the same as or equivalent to those shown in FIG. 6, are indicated by the same reference numerals as those of the constituent elements shown in FIG. 6, and additional description of those constituent elements is omitted.

61 indicates a serial line of the one-stage low pass filter type matching unit 42. 62 indicates a bias supply short stub of the one-stage high pass filter type matching unit 43. A length of the bias supply short stub 62 is equal to or shorter than ¼ of the wavelength of the signal.

Next, an operation of the multistage amplifier will be described below.

In the second embodiment, the one-stage low pass filter type matching unit 42 comprises the parallel capacitor 44 and the serial inductor 45, and the one-stage high pass filter type matching unit 43 comprises the parallel inductor 46 and the serial capacitor 47. However, in the fourth embodiment, the one-stage low pass filter type matching unit 42 comprises the serial line 61 in place of the serial inductor 45, and the one-stage high pass filter type matching unit 43 comprises the bias supply short stub 62 having the length equal to or shorter than ¼ of the wavelength of the signal in place of the parallel inductor 46.

A serial line has the same electric characteristic as that of a serial inductor. Also, in cases where a parallel short stub has a length equal to or shorter than ¼ of a wavelength of a signal, the parallel short stub has the same electric characteristic as that of a parallel inductor.

Accordingly, because the inter-stage matching circuit 26 of the multistage amplifier comprises the one-stage low pass filter type matching unit 42 having the serial line 61 and the one-stage high pass filter type matching unit 43 having the bias supply short stub 62, the output load impedance $\Gamma_{out}$ of the front-stage amplifying element 23 can almost agree with the optimum output load impedance $\Gamma_{opt\_out}$, and the input source impedance $\Gamma_{in}$ of the rear-stage amplifying element 24 can almost agree with the optimum input source impedance $\Gamma_{opt\_in}$.

Therefore, because an inter-stage matching condition of the multistage amplifier can be further optimized, the efficiency of the whole multistage amplifier can be heightened.

Also, because the one-stage high pass filter type watching unit 43 comprises the bias supply short stub 62 having the length equal to or shorter than ¼ of the wavelength of the signal in place of the parallel inductor 46, the bias supply short stub 62 can be used as a bias supply line placed on the output side of the front-stage amplifying element 23. Therefore, a small-sized multistage amplifier can be obtained.

INDUSTRIAL APPLICABILITY

As is described above, in cases where satellite communication, terrestrial microwave communication or mobile communication is performed, the multistage amplifier according to the present invention is appropriate to amplify a transmission signal or a receiving signal.

What is claimed is:

1. A multistage amplifier, comprising:
   a plurality of amplifying elements for amplifying an input signal stage by stage and outputting an amplified signal; and
   a two-stage matching circuit, directly connected between each pair of amplifying elements adjacent to each other, for performing an impedance matching between the pair of amplifying elements,
   wherein the two-stage matching circuit comprises:
   a high pass filter type matching unit, having a parallel inductor and a serial capacitor, formed only in a single stage; and
   a low pass filter type matching unit formed only in a single stage, and
   wherein the low pass filter type matching unit is serially connected with the high pass filter type matching unit.

2. A multistage amplifier, comprising:
   a plurality of amplifying elements for amplifying an input signal stage by stage and outputting an amplified signal; and
   a two-stage matching circuit, directly connected between each pair of amplifying elements adjacent to each other, for performing an impedance matching between the pair of amplifying elements,
   wherein the two-stage matching circuit arranged between the final-stage amplifying element and the amplifying element placed just before the final-stage amplifying element comprises:
   a high pass filter type matching unit, having a parallel inductor and a serial capacitor, formed only in a single stage;
   a low pass filter type matching unit formed only in a single stage, and
   wherein the low pass filter type matching unit is serially connected with the high pass filter type matching unit.

3. A multistage amplifier according to claim 1, wherein the high pass filter type matching unit is placed on an input side of the input signal, and the low pass filter type matching unit is placed on an output side of the amplified signal.

4. A multistage amplifier according to claim 1, wherein the low pass filter type matching unit is placed on an input side of the input signal, and the high pass filter type matching unit is placed on an output side of the amplified signal.

5. A multistage amplifier according to claim 1, wherein a bias supply short stub having a length equal to or shorter than ¼ of a wavelength of the input signal is used as the parallel inductor.

6. A multistage amplifier according to claim 1, wherein the low pass filter type matching unit comprises a parallel capacitor and a serial inductor.

7. A multistage amplifier according to claim 6, wherein a serial line is used as the serial inductor.

8. A multistage amplifier according to claim 2, wherein the high pass filter type matching unit is placed on an input side of the input signal, and the low pass filter type matching unit is placed on an output side of the amplified signal.

9. A multistage amplifier according to claim 2, wherein the low pass filter type matching unit is placed on an input side of the input signal, and the high pass filter type matching unit is placed on an output side of the amplified signal.

10. A multistage amplifier according to claim 2, wherein a bias supply short stub having a length equal to or shorter than ¼ of a wavelength of the input signal is used as the parallel inductor.

11. A multistage amplifier according to claim 2, wherein the high pass filter type matching unit is placed on an input side of the input signal, and the low pass filter type matching unit is placed on an output side of the amplified signal.

12. A multistage amplifier according to claim 2, wherein a serial line is used as the serial inductor.

13. The multistage amplifier according to claim 1, wherein the low-pass filter type matching unit has a serial inductor and a parallel capacitor, and wherein the serial capacitor, the parallel capacitor, and the serial inductor are connected with one another with a direct electrical connection.

14. The multistage amplifier according to claim 1, wherein
the high pass filter type matching unit in the single stage is made up of only the parallel inductor and the serial capacitor arranged in direct electrical connection in order from the input side of the high pass filter type matching unit; and
the low pass filter type matching unit in the single stage is made up of only a parallel capacitor and a serial inductor arranged in direct electrical connection in order from the input side of the low pass filter type matching unit.

15. The multistage amplifier according to claim 14, wherein an impedance between the high pass filter type matching unit in the single stage and the low pass filter type matching unit in the single stage is set to a value between the impedance values of a pair of the amplifying elements adjacent to each other.

16. A multistage amplifier according to claim 2,
wherein the low-pass filter type matching unit has a serial inductor and a parallel capacitor, and
wherein the serial inductor, the parallel inductor, and the serial capacitor are connected with one another with a direct electrical connection.

17. A multistage amplifier according to claim 2, wherein
in the high pass filter type matching unit in the single stage, the parallel inductor and the serial capacitor are arranged in direct electrical connection in order from the input side of the high pass filter type matching unit;
the low pass filter type matching unit in the single stage is formed only by a parallel capacitor and a serial inductor; and
the serial inductor, the parallel inductor, and the serial capacitor are connected with one another with a direct electrical connection in order from the input side of the low pass filter type matching unit.

18. A multistage amplifier according to claim 17, wherein
an impedance between the high pass filter type matching unit in the single stage and the low pass filter type matching unit in the single stage is set to a value between the impedance values of a pair of the amplifying elements adjacent to each other.

19. A multistage amplifier, comprising:
a plurality of amplifying elements for amplifying an input signal stage by stage and outputting an amplified signal; and
a matching circuit, directly connected between each pair of amplifying elements adjacent to each other, for performing an impedance matching between the pair of amplifying elements,
wherein the matching circuit consists of:
a one-stage high pass filter type matching unit having a parallel inductor and a serial capacitor; and
a one-stage low pass filter type matching unit having a parallel capacitor and a serial inductor,
wherein the one-stage low pass filter type matching unit is serially connected with the one-stage high pass filter type matching unit, and
wherein the serial capacitor, the parallel capacitor, and the serial inductor are connected with one another with a direct electrical connection.

20. A multistage amplifier, comprising:
a plurality of amplifying elements for amplifying an input signal stage by stage and outputting an amplified signal; and
a matching circuit, directly connected between each pair of amplifying elements adjacent to each other, for performing an impedance matching between the pair of amplifying elements,
wherein the matching circuit arranged between the final-stage amplifying element and the amplifying element placed just before the final-stage amplifying element consists of:
a one-stage high pass filter type matching unit having a parallel inductor and a serial capacitor; and
a one-stage low pass filter type matching unit having a parallel capacitor and a serial inductor,
wherein the one-stage low pass filter type matching unit is serially connected with the one-stage high pass filter type matching unit, and
wherein the serial inductor, the parallel inductor, and the serial capacitor are connected with one another with a direct electrical connection.

21. A multistage amplifier, comprising:
a plurality of amplifying elements for amplifying an input signal stage by stage and outputting an amplified signal; and
a two-stage matching circuit, directly connected between each pair of amplifying elements adjacent to each other, for performing an impedance matching between the pair of amplifying elements,
wherein the two-stage matching circuit comprises:
a high pass filter type matching unit having only a parallel inductor and a serial capacitor, thereby forming a first stage; and
a low pass filter type matching unit having only a serial inductor and a parallel capacitor, thereby forming a second stage, and
wherein the low pass filter type matching unit is serially connected with the high pass filter type matching unit.

22. The multistage amplifier according to claim 21, wherein the first stage and the second stage form the two-stage matching circuit.

23. A multistage amplifier, comprising:
a plurality of amplifying elements for amplifying an input signal stage by stage and outputting an amplified signal; and
a two-stage matching circuit, directly connected between each pair of amplifying elements adjacent to each other, for performing an impedance matching between the pair of amplifying elements,
wherein the two-stage matching circuit arranged between the final-stage amplifying element and the amplifying element placed just before the final-stage amplifying element comprises:
a one-stage high pass filter type matching unit having only a parallel inductor and a serial capacitor, thereby forming a first stage; and
a low pass filter type matching unit having only a serial inductor and a parallel capacitor, thereby forming a second stage, and
wherein the low pass filter type matching unit is serially connected with the high pass filter type matching unit.

24. The multistage amplifier according to claim 23, wherein the first stage and the second stage form the two-stage matching circuit.

25. A multistage amplifier, comprising:
a plurality of amplifying elements for amplifying an input signal stage by stage and outputting an amplified signal; and
a matching circuit, directly connected between each pair of amplifying elements adjacent to each other, for performing an impedance matching between the pair of amplifying elements, wherein the matching circuit consists of:

a one-stage high pass filter type matching unit having a parallel inductor and a serial capacitor; and a one-stage low pass filter type matching unit having a serial inductor and a parallel inductor.

26. The multistage amplifier according to claim 25, wherein the low pass filter type matching unit is serially connected with the high pass filter type matching unit.

27. A multistage amplifier, comprising:

a plurality of amplifying elements for amplifying an input signal stage by stage and outputting an amplified signal; and a matching circuit, directly connected between each pair of amplifying elements adjacent to each other, for performing an impedance matching between the pair of amplifying elements, wherein the matching circuit arranged between the final-stage amplifying element and the amplifying element placed just before the final-stage amplifying element consists of:

a one-stage high pass filter type matching unit having a parallel inductor and a serial capacitor; and a one-stage low pass filter type matching unit having a serial inductor and a parallel capacitor.

28. The multistage amplifier according to claim 27, wherein the low pass filter type matching unit is serially connected with the high pass filter type matching unit.

* * * * *